(12) United States Patent
Lue

(10) Patent No.: US 6,906,940 B1
(45) Date of Patent: Jun. 14, 2005

(54) PLANE DECODING METHOD AND DEVICE FOR THREE DIMENSIONAL MEMORIES

(75) Inventor: Hang-Ting Lue, Hsinchu (TW)

(73) Assignee: Macronix International Co., Ltd. (TW)

(*) Notice: Subject to any disclaimer, the term of this patent is extended or adjusted under 35 U.S.C. 154(b) by 0 days.

(21) Appl. No.: 10/779,147

(22) Filed: Feb. 12, 2004

(51) Int. Cl.[7] .................................. G11C 5/06
(52) U.S. Cl. .................. 365/63; 365/185.05; 365/51
(58) Field of Search .................. 365/63, 185.05, 365/51, 225.7, 163, 185.18

(56) References Cited

U.S. PATENT DOCUMENTS

2004/0057276 A1 * 3/2004 Nejad et al. ............... 365/158
2004/0190360 A1 * 9/2004 Scheuerlein ............. 365/225.7

* cited by examiner

Primary Examiner—Richard Elms
Assistant Examiner—Dang Nguyen
(74) Attorney, Agent, or Firm—Martine Penilla & Gencarella LLP (57) ABSTRACT

A multi-layer memory device is provided. The multi-layer memory device includes multiple layers of memory core cells. A word plane electrically connecting each first active terminal of the multiple layers of the memory core cells intersected by the word plane is included. A drain plane substantially orthogonal to the word plane is provided. The drain plane electrically connects each second active terminal of the multiple layers of the memory core cells intersected by the drain plane. A source plane substantially orthogonal to both the word plane and the drain plane is included. The source plane electrically connects each third active terminal of the memory core cells within a single level. In one embodiment, the memory core cells are defined by a device having three active terminals.

23 Claims, 10 Drawing Sheets

PLANE DECODING METHOD AND DEVICE FOR THREE DIMENSIONAL MEMORIES

BACKGROUND OF THE INVENTION

The present invention relates generally to memory devices and, more particularly, to a three dimensional memory cell structure utilizing a plane decoding technique.

Figure 1:
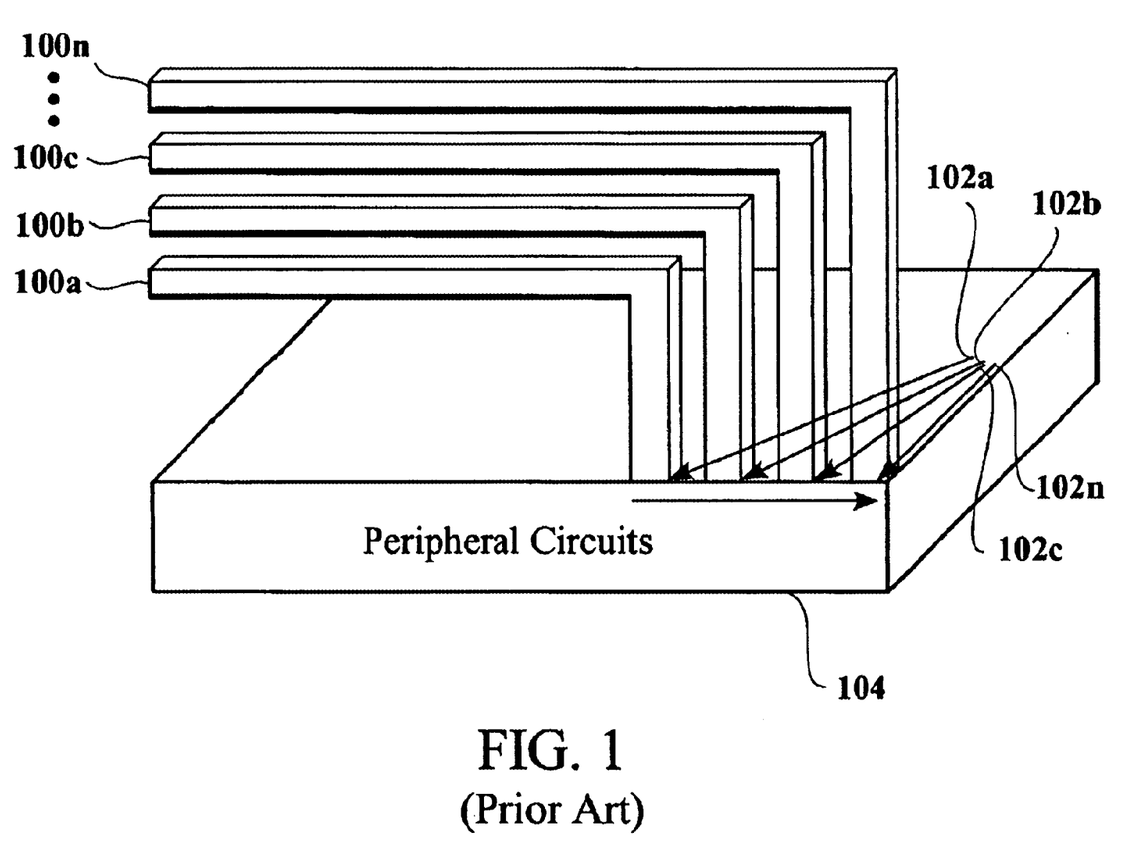
FIG. 1 illustrates the large area for contact holes required for the traditional line decoding method, where independent word lines and bit lines are connected to their own contact holes for a three dimensional memory structure.

Conventional memory architectures employ word lines and bit lines to access the memory cells defined by the memory architecture. Three dimensional memory structures include several memory layers that are stacked upon each other. FIG. 1 illustrates the large area for contact holes required for the independent word lines and bit lines for a three dimensional memory structure. Peripheral circuits 104 are connected to the word lines and bit lines from layers 100*a*–100*n* through corresponding contact holes 102*a*–102*n*. For example, lines 100*a*–100*n* may represent bit lines from the first, second, third and nth layer of the memory structure, respectively. Since lines 100*a*–100*n* of the different layers are independent, then respective contact holes 102*a*–102*n* cannot be common. It should be appreciated that the same would be applicable if lines 100*a*–100*n* were word lines. Thus, the multitude of contact holes requires a large area and leads to reduced array efficiency. As the number of layers increase, the contact area must expand outwards, thereby offsetting density gains achieved through the three dimensional structure.

In general the number of contact holes may be represented by $N_x*N_z+N_y*N_z$ where $N_z$ represents the number of layers, and $N_x$ and $N_y$ are the number of arrays in x- and y-direction, respectively. Where the structure has shared word lines and bit lines the number of contact holes may be represented by $2*N_x+N_y*N_z$. Thus, as the number of layers ($N_z$) increases the number of required contact holes increases dramatically, thereby wasting chip area.

In light of the foregoing, there is a need for a structure and decoding method that limits the number of contact holes for a three dimensional memory structure.

SUMMARY OF THE INVENTION

Broadly speaking, the present invention enables a decoding scheme in which word line and bit line concepts are extended to planes associated with common word lines and bit lines. The structure defined herein enables a dramatic reduction in the number of contact holes.

In accordance with one aspect of the present invention, a multi-layer memory device is provided. The multi-layer memory device includes multiple layers of memory core cells. A word plane electrically connecting each first active terminal of the multiple layers of the memory core cells intersected by the word plane is included. A drain plane substantially orthogonal to the word plane is provided. The drain plane electrically connects each second active terminal of the multiple layers of the memory core cells intersected by the drain plane. A source plane substantially orthogonal to both the word plane and the drain plane is included. The source plane electrically connects each third active terminal of the memory core cells within a single level. In one embodiment, the memory core cells are defined by a device having three active terminals.

In accordance with another aspect of the present invention, a plane decoding method for a multi-layer memory device is provided. The plane decoding method initiates with defining a source plane in electrical communication with first active terminals associated with memory core cells within a level of the multi-layer memory device. The method includes interconnecting second active terminals associated with memory core cells of the multi-layer memory device with a word plane intersecting each level of the multi-layer memory device. The method further includes interconnecting third active terminals associated with memory core cells of the multi-layer memory device with a drain plane intersecting each level of the multi-layer memory device. In one embodiment, a state change element is included with each of the third active terminals.

In accordance with yet another aspect of the present invention, a method for accessing a memory core cell of a multi-layer memory device is provided. The method initiates with defining a first plane of memory core cells associated with a single layer of the multi-layer memory device. The method includes defining a second plane of memory core cells associated with multiple layers of the multi-layer memory device. The second plane is substantially orthogonal to the first plane. The method further includes defining a third plane of memory core cells associated with the multiple layers of the multi-layer memory device. The third plane is substantially orthogonal to both the first plane and the second plane. Then, a voltage is applied to first and second terminals associated with each of the memory core cells of the second plane and the third plane. Thus, the current from the third active terminal defined at the intersection of the first second and third planes may be read in order to obtain the logical value stored therein.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Several exemplary embodiments of the invention will now be described in detail with reference to the accompanying drawings.

In accordance with the present invention, a multi-layer memory structure, i.e., a memory structure having multiple levels of memory core cells, that incorporates a plane decoding scheme in place of a line decoding scheme is provided. A memory core cell of the multi-layer structure is accessed by intersection of three planes. Two of the three planes access an active terminal of memory core devices, where the memory core devices are defined in each level of the multi-layer structure. One of the three planes accesses an active terminal of the memory core devices, where the memory core devices are defined within a single level of the multi-layer structure. Thus, as two of the three planes include word lines or bit lines that are electrically connected within the corresponding plane, via holes for the contacts may be directly stacked upon each other. Thus, the contact hole area is dramatically reduced due to the common via hole configurations in the two planes.

Figure 2:
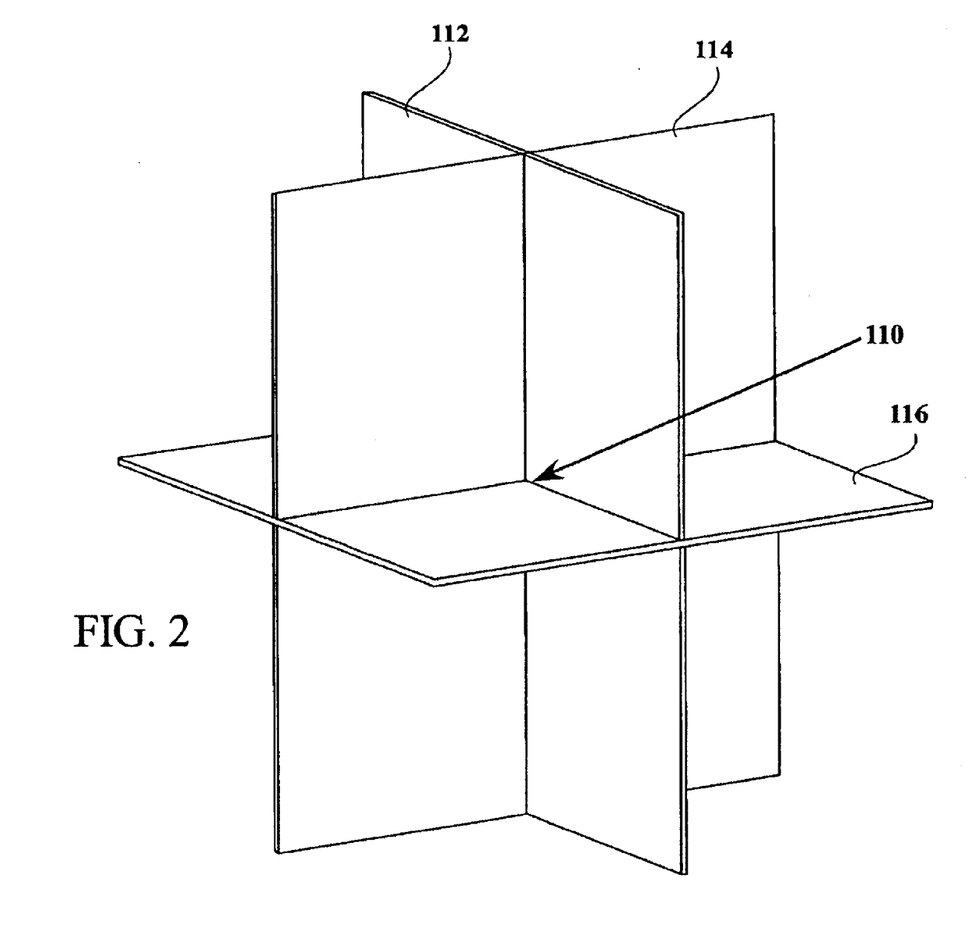
FIG. 2 is a simplified schematic diagram illustrating a plane decoding scheme in accordance with one embodiment of the invention.

FIG. 2 is a simplified schematic diagram illustrating a plane decoding scheme in accordance with one embodiment of the invention. Here, memory core cell 110 is selected by the intersection of planes 112, 114 and 116. Thus, the conventional concept of the word lines and bit lines is extended to planes 112, 114 and 116. Planes 112, 114 and 116 correspond to the drain plane, word plane, and source plane, respectively, as will be explained in more detail below. It should be appreciated that since the word lines and bit lines in the different layers are configured to be electrically interconnected through a common plane, the required contact holds for the data decoding is dramatically reduced as discussed in more detail below. In general, the number of contact holds is equal to $N_x + N_y + N_z$. As explained below, this reduction is due to the ability to stack the contacts for the multi-layers directly over each other, i.e., the contact holes share a common axis.

Figure 3:
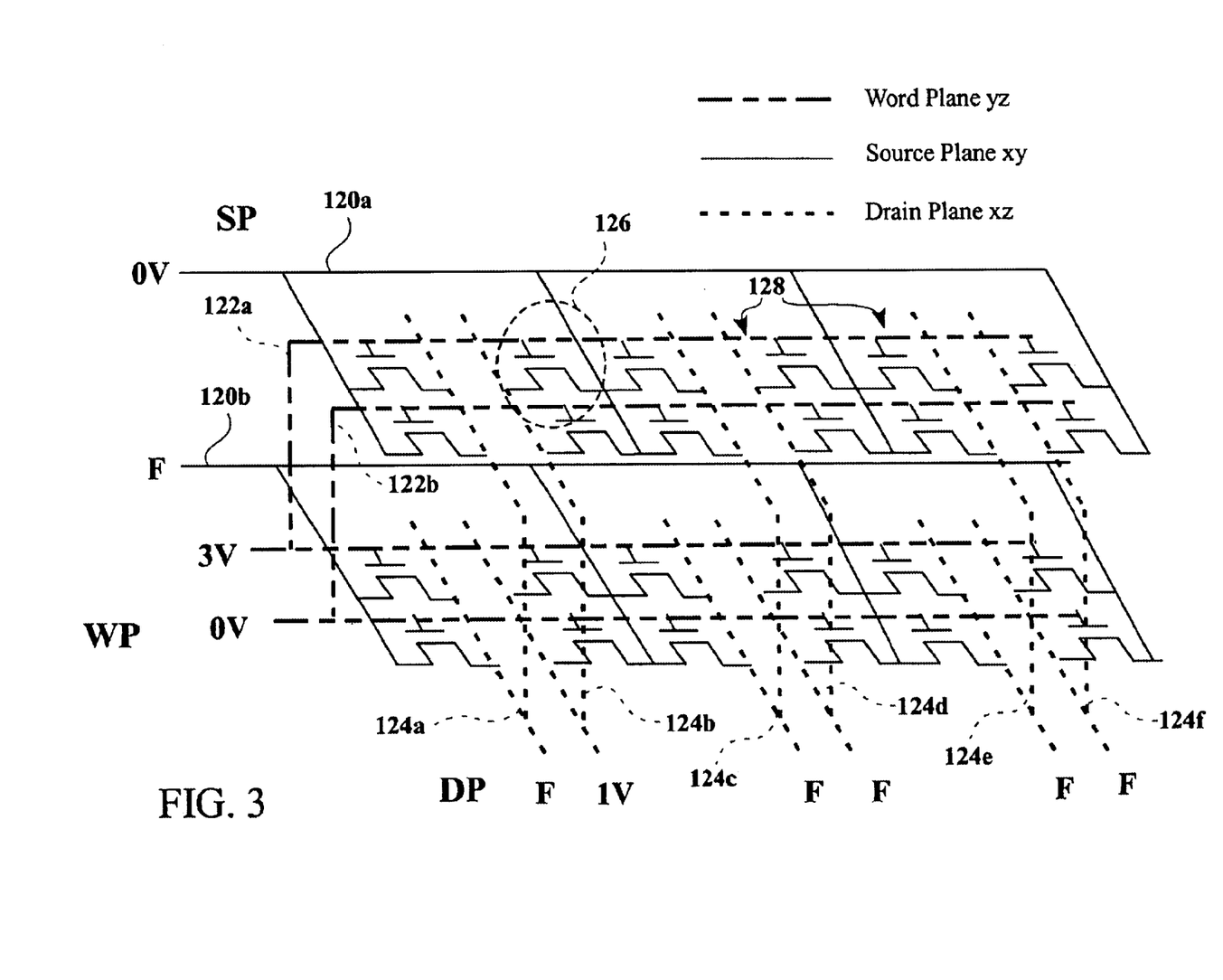
FIG. 3 is a simplified schematic diagram illustrating a common ground three dimensional MASKROM in accordance with one embodiment of the invention.

FIG. 3 is a simplified schematic diagram illustrating a common ground three dimensional MASKROM in accordance with one embodiment of the invention. Here, three planes, each of which is substantially orthogonal to each other, are defined in association with the multi-level memory device. The three planes include word planes 122a and 122b, source planes 120a and 120b, and drain planes 124a through 124f. As can be seen, word planes 122a and 122b are oriented in the yz plane, source plane 120a is oriented in the xy plane, and drain planes 124a through 124f are oriented in the xz plane. Memory core cells 128 include a three terminal device, e.g., a source, gate, and drain terminals. As can be seen, word planes 122a and 122b interconnect a first terminal (gate) of each three terminal device of the core cells within the multi-layers intersected by the corresponding word planes. Drain planes 124a through 124f interconnect a second terminal (drains) of the three-terminal devices of memory cores intersected by the corresponding drain planes. Source planes 120a and 120b interconnect a third terminal (sources) of the three terminal devices for each memory core cell within the source plane. It should be appreciated that a source plane exists for each level of the multi-level memory structure described herein. It should be further appreciated that while FIG. 3 illustrates a source, gate, and drain as the three terminal device within memory core cells 128, any suitable three terminal device may be used. As illustrated in FIG. 3, the cell drain current associated with memory core cell 126 is read by applying three volts to word plane 122a, one volt to drain plane 124b and zero volts to source plane 120a. Furthermore, unselected word plane 122b and any other unselected word plane is applied a voltage of zero volts, while unselected drain planes and unselected source planes are left floating. Thus, the value stored in memory core cell 126 may be determined through the measurement of this current in one embodiment. Furthermore, any of core cells 128 may be read based upon the voltages applied to the particular planes.

Figure 4A:
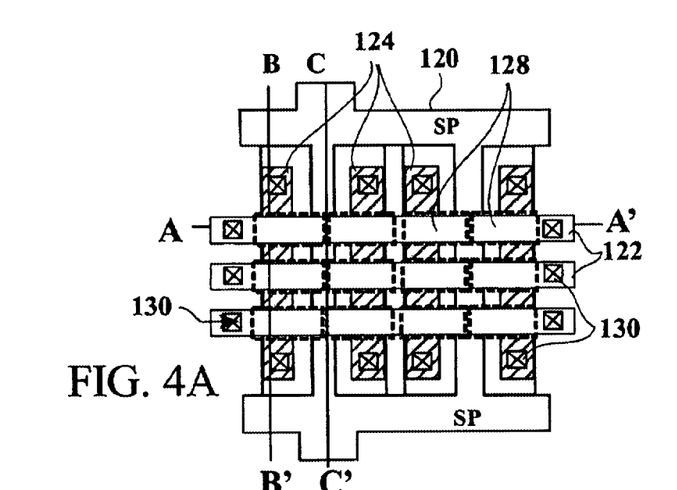
FIGS. 4A through 4D illustrate top and cross section views of the three-dimensional MASKROM of FIG. 3.
Figure 4B:
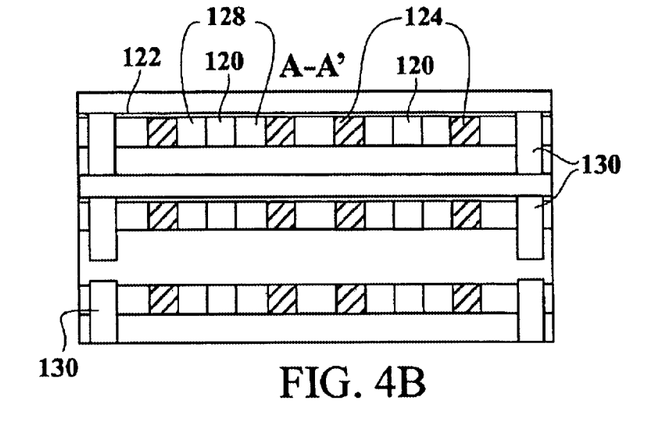
Figure 4C:
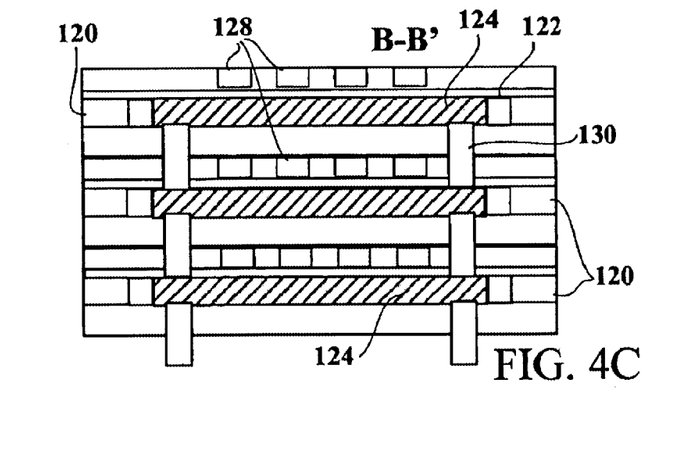
Figure 4D:
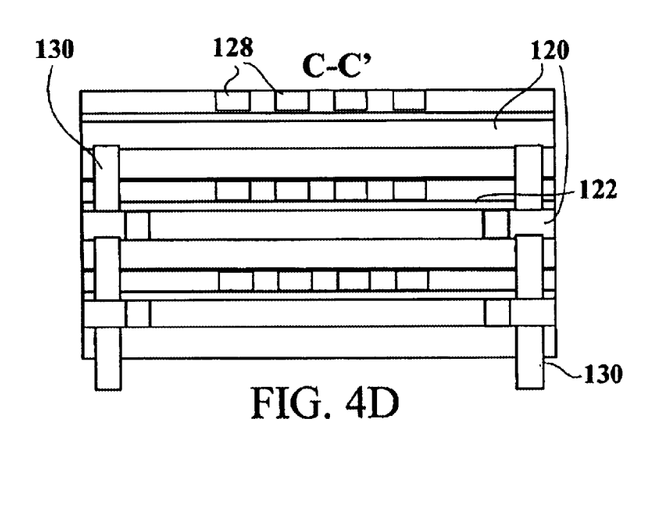

FIGS. 4A through 4D illustrate top and cross section views of the three-dimensional MASKROM of FIG. 3. FIG. 4A represents a top view looking upon a source plane 120 corresponding to one layer of a multi-level memory structure for a three-dimensional MASKROM. Contacts 130 are defined within drain planes 124 and word planes 122. FIGS. 4B through 4D illustrate cross sectional views of FIG. 4A as represented therein. In FIG. 4A, a top cross sectional view is illustrated. Here, source plane 120, word plane 122 and drain plane 124 are each illustrated. As can be seen in FIGS. 4B–4D, contacts 130 are stacked over each other as enabled by the plane decoding scheme described herein. Three terminal devices 128, which may be transistors, are illustrated in each of FIGS. 4A–4D.

Figure 5:
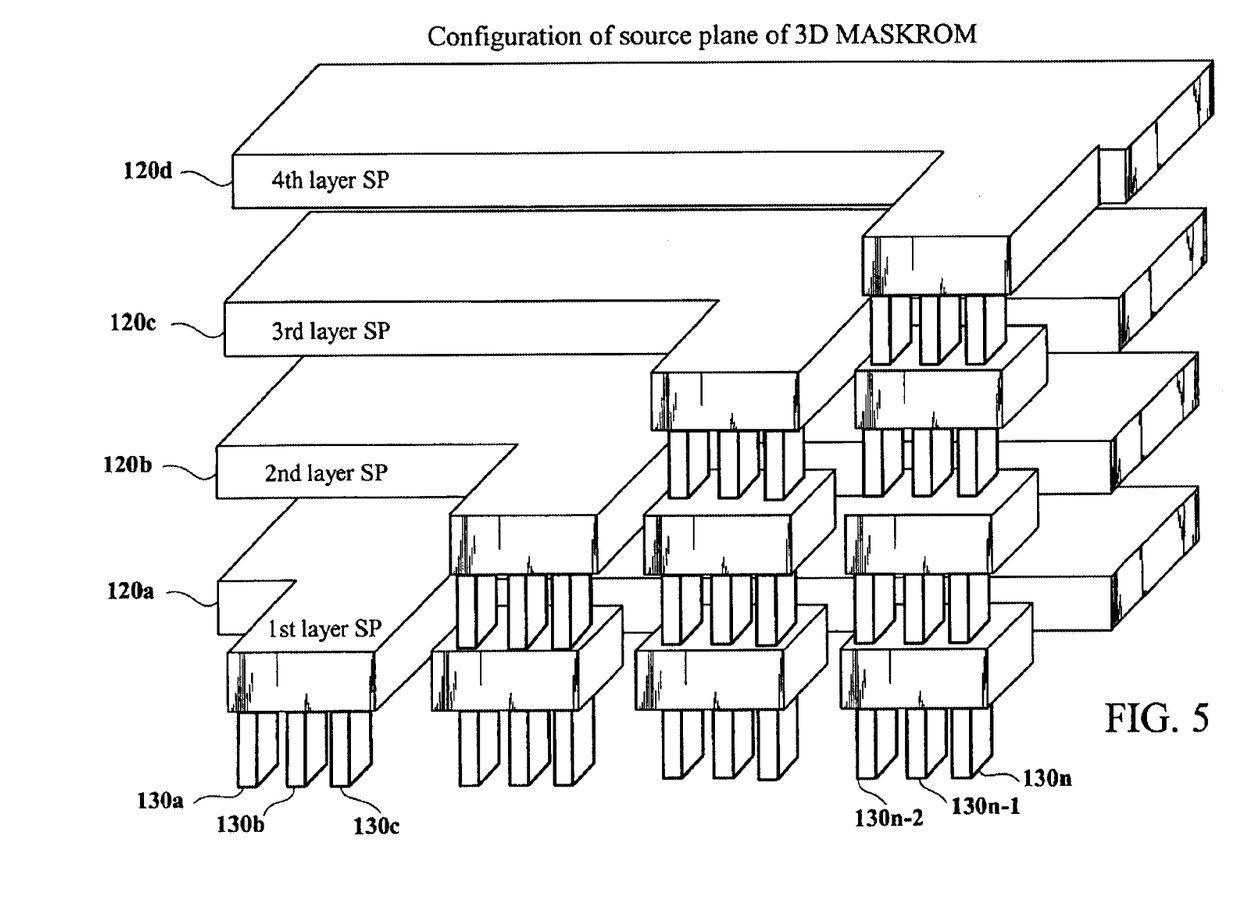
FIG. 5 is a simplified schematic diagram illustrating the configuration of source planes associated with the 3D MASKROM having a multi-level structure in accordance with one embodiment of the invention.

FIG. 5 is a simplified schematic diagram illustrating the configuration of source planes associated with the 3D MASKROM having a multi-level structure in accordance with one embodiment of the invention. Referring back to FIG. 4, it should be appreciated that the contact hole area needed for the matrix is dramatically reduced due to the common via hole configuration for the word plane and drain planes. Thus, as illustrated in FIG. 5, it should be noted that the layouts in all of the layers are the same, except for the source plane. Since the layouts for the drain plane and the word plane are the same, the cost for masks in a multi-layer MASKROM is significantly reduced. Layers 120a through 120d are illustrated having slightly different configurations in order to accommodate contacts 130a–130n. Therefore, the masks associated with each of these layers will be different. However, the contacts for the multiple layers may be stacked as illustrated by the contacts associated with each of layers 120a through 120c. That is, contacts 130a through 130n are defined by stacked vias for each layer. Consequently, as the number of layers increases, the contact area does not expand outwards as quickly relative to the word line/bit line (traditional line decoding method) configuration.

Figure 6:
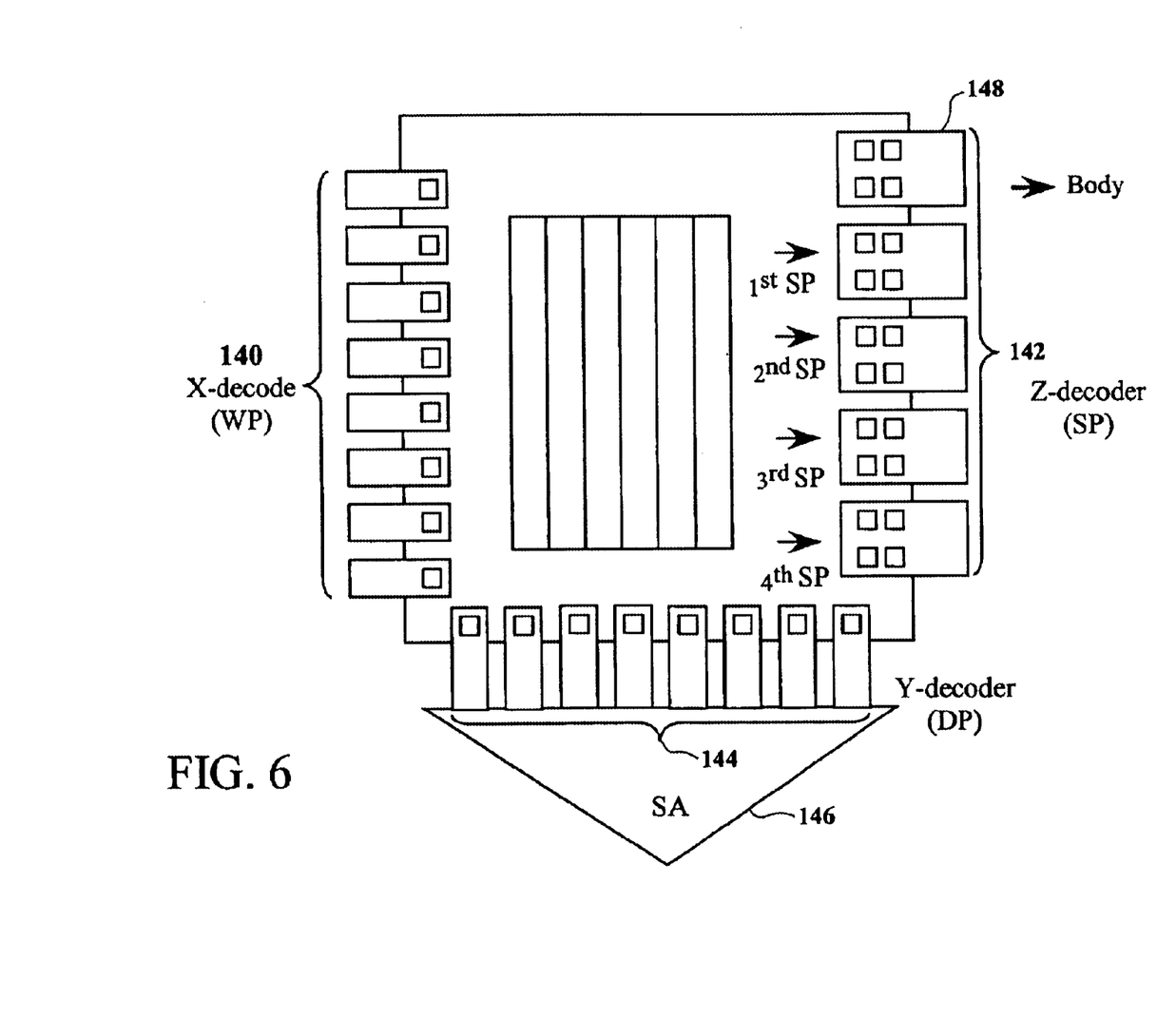
FIG. 6 is a simplified schematic diagram of a decoding scheme for a 3D MASKROM in accordance with one embodiment of the invention.

FIG. 6 is a simplified schematic diagram of a decoding scheme for a 3D MASKROM in accordance with one embodiment of the invention. Here, the word plane is pinned out as X decoder 140, the drain plane acts as Y decoder 144. Y decoder 144 is in communication with sense amplifier region 146. The source plane acts as Z decoder 142. One skilled in the art will appreciate that body 148 may be floating or common to ground in order to suppress floating body effects. In one embodiment, Z-decoder pads are placed around the same sides of X decoder 140 and Y decoder 144, in order to utilize the space taken by the Z decoder pads for another purpose.

Figure 7:
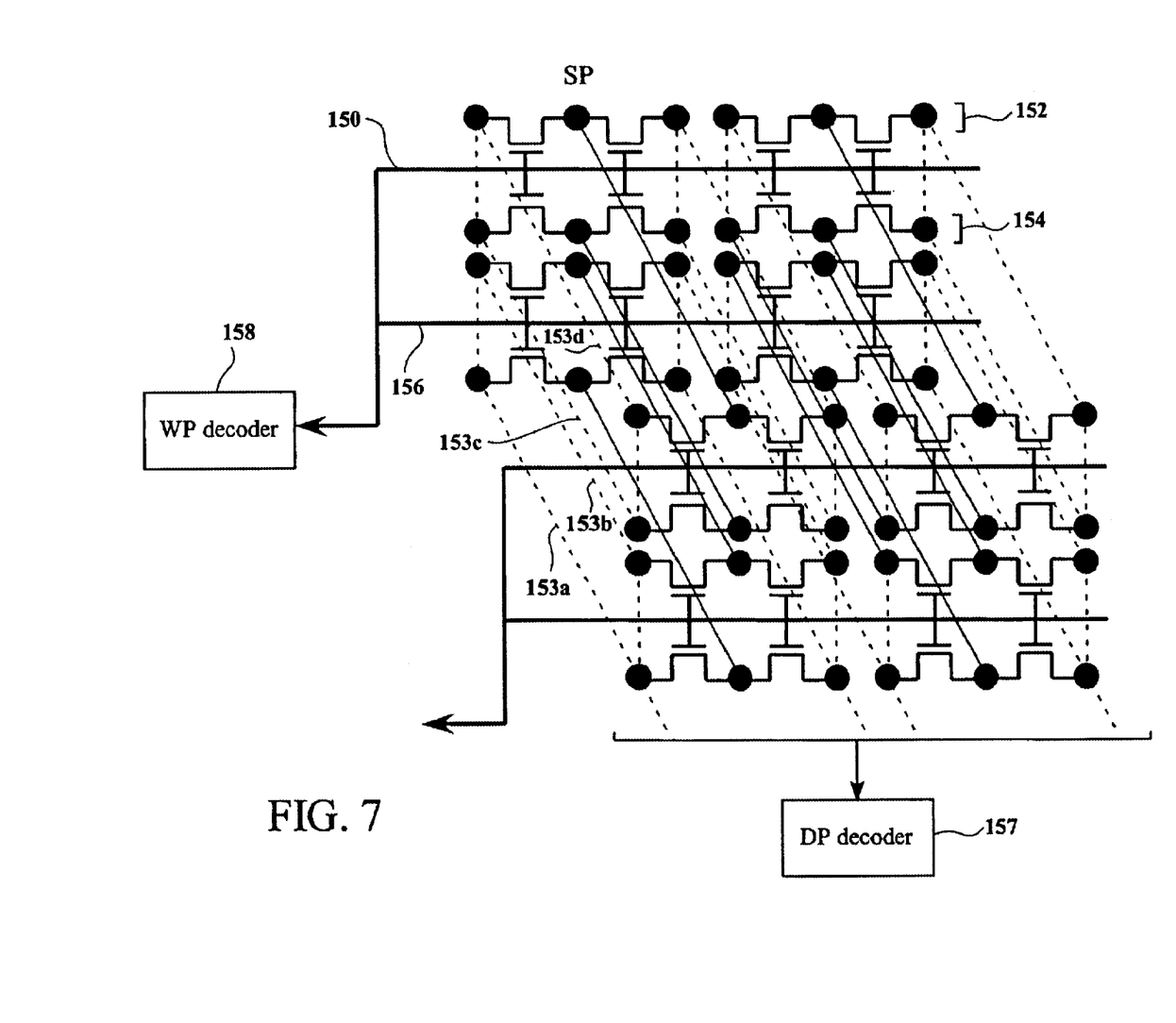
FIG. 7 is a simplified schematic diagram illustrating a configuration in which the word plane is shared in accordance with one embodiment of the invention.

FIG. 7 is a simplified schematic diagram illustrating a configuration in which the word plane is shared in accordance with one embodiment of the invention. Here, word line 150 of a word plane is shared by two adjacent layers 152 and 154 of memory core cells of the multi-layer structure. It will be apparent to one skilled in the art that a bottom gate thin film transistor (TFT) may be incorporated here. It should be appreciated that the word plane includes multiple word lines electrically connected. That is, the multiple word lines define a plane referred to as a word plane. Word lines 150 and 156 of one of the word planes is in communication with word plane decoder 158. Likewise, lines 153a–153d, which may be referred to a bit lines, provide the basis for a drain plane. This drain plane is in communication with drain plane decoder 157.

Figure 8A:
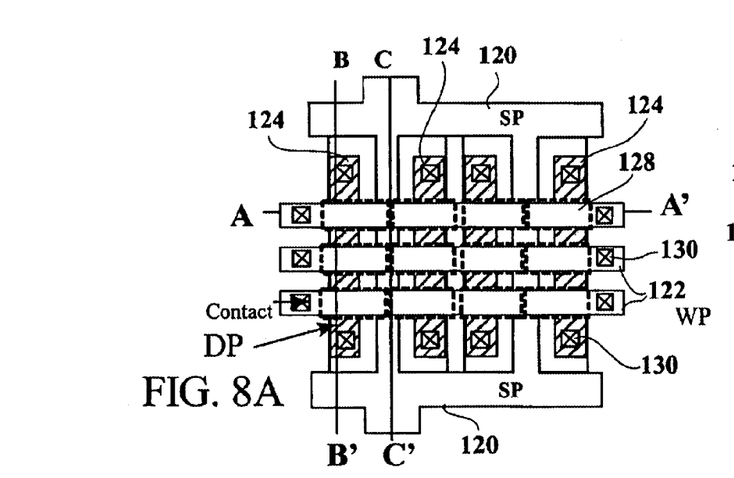
FIGS. 8A through 8D illustrate top and cross-section views of a three-dimensional MASKROM incorporating the shared word plane of FIG. 7.
Figure 8B:
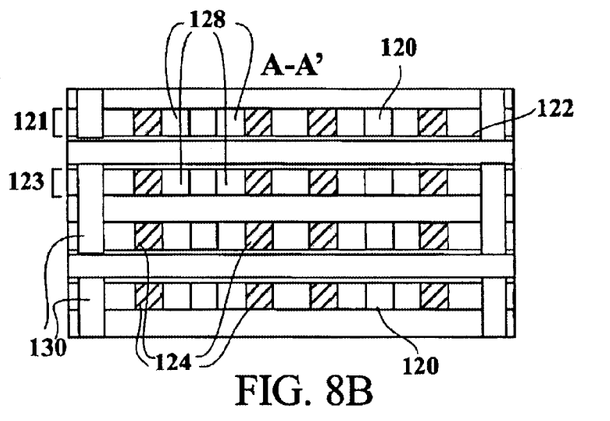
Figure 8C:
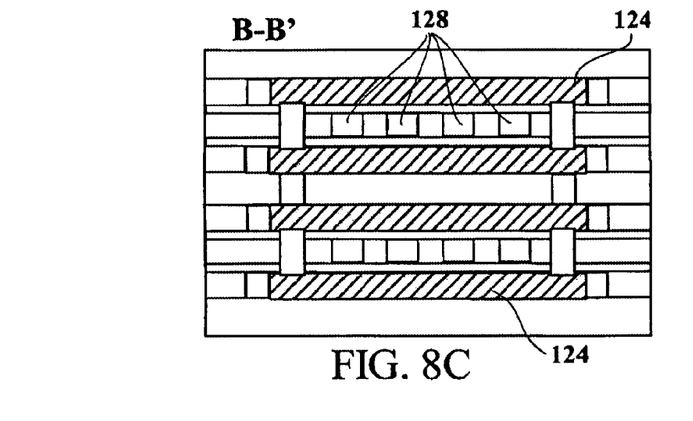
Figure 8D:
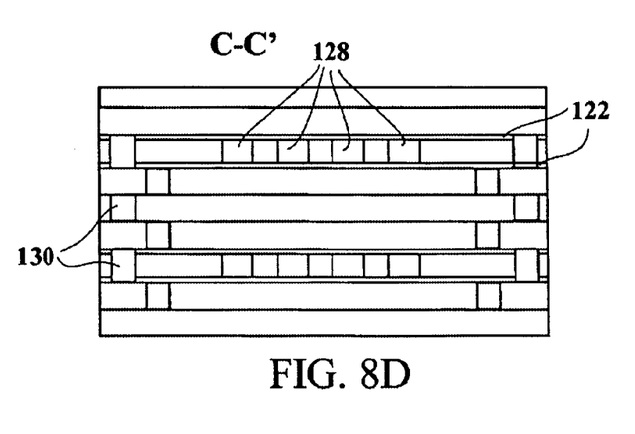

FIGS. 8A through 8B illustrate top and cross-section views of a three-dimensional MASKROM incorporating the shared word plane of FIG. 7. One skilled in the art will appreciate that the configurations which incorporate the shared word plane result in fewer process steps and photo masks. Accordingly, it will be less expensive to produce these embodiments due to the fewer process steps and photo masks required. FIGS. 8A–8D are similar views to FIGS. 4A–4D, respectively. However, in FIGS. 8A–8D word plane 122 is shared by layers 121 and 123.

Figure 9:
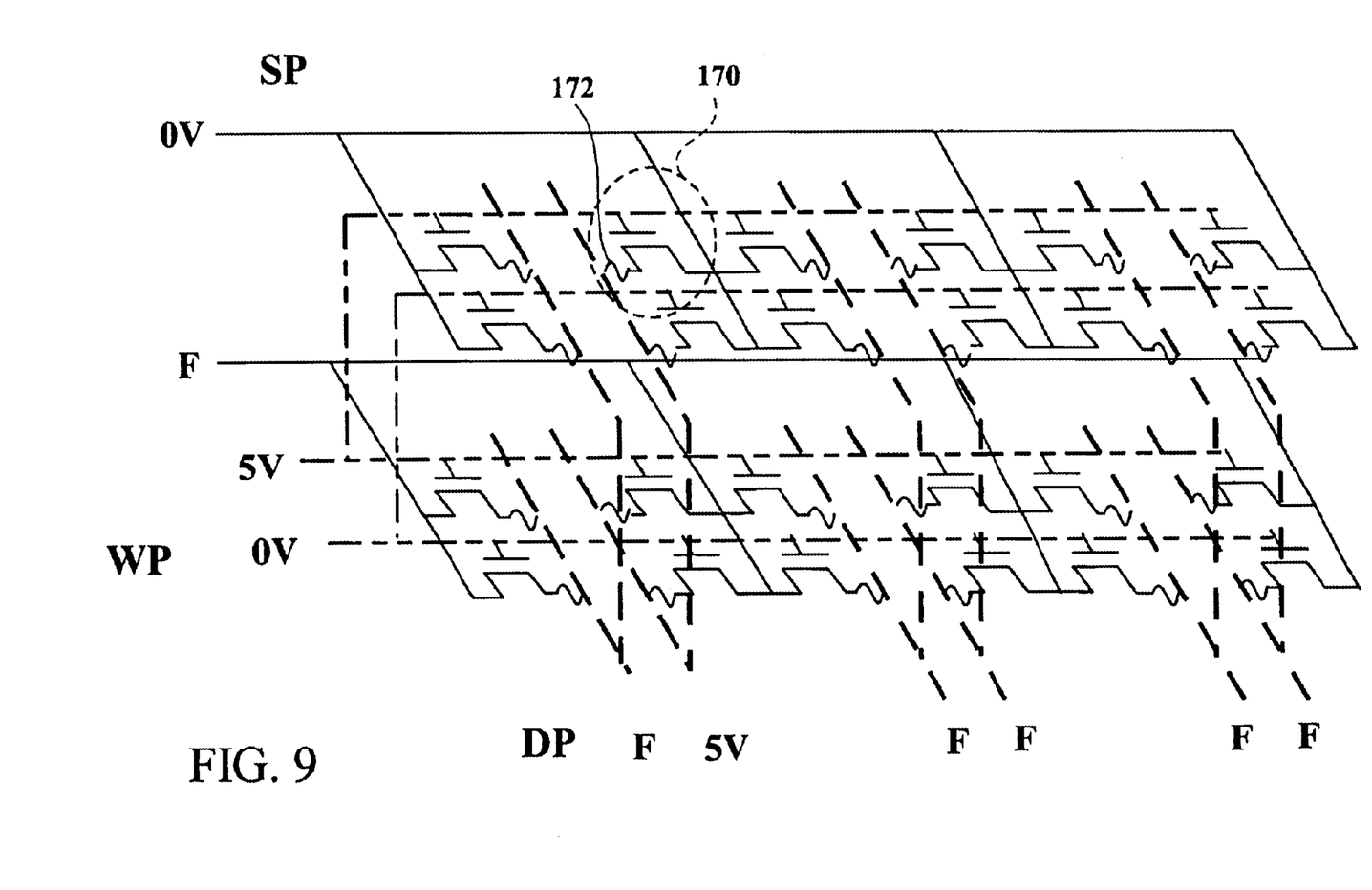
FIG. 9 is a simplified schematic diagram illustrating a three-dimensional multi-time programmable (MTP)/one-time programmable (OTP) memories incorporating the plane decoding scheme in accordance with one embodiment of the invention.

FIG. 9 is a simplified schematic diagram illustrating a three-dimensional multi-time programmable (MTP)/one-time programmable (OTP) memories incorporating the plane decoding scheme in accordance with one embodiment of the invention. As illustrated in FIG. 9, memory core cell 170 includes a three-terminal device in which a state change element is included in the drain side of the three-terminal device. For example, the memory core cell may be fabricated by a TFT device. The drain side of the TFT's are connected to a state change element 172. The state change element may be an anti-fuse, fuse, or state change material, (such as chalcogenide). Further information on chalcogenide is included in U.S. application Ser. No. 10/465,120, which is hereby incorporated in its entirety for all purposes. Programming of cell 170 is carried out by activating the corresponding word plane, drain plane, and source plane and providing current to the selected state change element. The programming current results in the resistance change of the state change element. This resistance change, in turns, leads to a read current difference and can provide memory storage.

Figure 10:
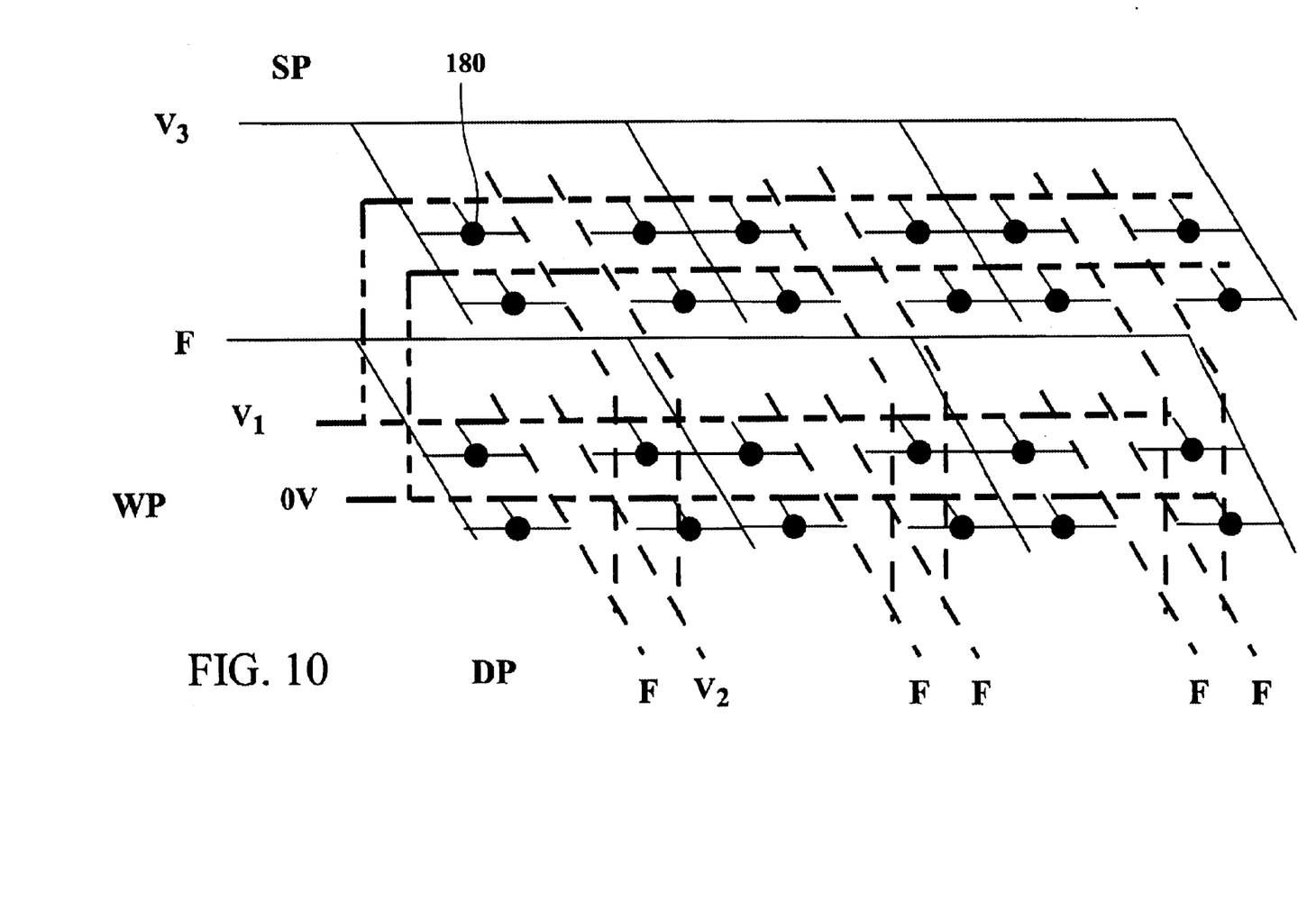
FIG. 10 is an alternative embodiment illustrating a three-dimensional memory with a three-terminal device incorporated as a memory core cell.

FIG. 10 is an alternative embodiment illustrating a three-dimensional memory with a three-terminal device incorporated as a memory core cell. It should be appreciated that while standard three-terminal devices have been illustrated above, the invention is not restricted to standard semiconductor devices such as MOSFET, BJT, etc. Alternative three-terminal devices 180, such as single electron devices (SET), NROM (with Oxide-Nitride-Oxide layer for memory storage), PHINES (similar to NROM with different programming method), and floating gate flash memories (with additional floating ploy gate inside the gate oxide) may also be employed. One skilled in the art will appreciate that the appropriate bias configurations depends on the device characteristics. In general, the adjacent drain planes in FIG. 10 can be merged together such that each plane is a virtual ground array (without any field isolation in each memory layer). In this architecture, larger density of memory arrays can be fabricated. However, the leakage path of the virtual ground array is much larger and should be taken into consideration in the circuit design.

In summary, the present invention provides a multi-layer memory structure in which a plane decoding technique is utilized to access the core cells. Since two of the planes electrically connect core cells from multi-layers, stacked via holes may be used for the contacts for multi-layers in order to minimize the area required for the contacts. With respect to a thin film transistor (TFT) MASKROM, the layouts in each of the layers is the same with the exception of the source plane layout. As a result, the cost of masks is reduced. In one embodiment, two adjacent layers may share a word line of a word plane to enable a bottom gate TFT to be incorporated. It should be appreciated that the threshold voltage of the cell can be raised by ion implantation, and the logic "1" or "0" of the cells are defined by a code mask.

With respect to a TFT flash memory, the memory cells may be floating gate devices, or nitrided storage memory such as NROM and PHINES. The embodiments described herein enable extending the conventional word line and bit line scheme to a word plane, drain plane, and source plane. In one embodiment, the hot electron programming method may be applied to the selected cell defined by the intersection of the three planes. Hot electron programming method refers to the use of high energy "hot" electrons accelerated by a channel field being injected into a floating gate. With respect to one time programmable (OTP)/many time programmable (MTP) memories, the drain side of the TFTs may be connected to a state change element as discussed above. Programming the cell is carried out by activating the word plane, drain plane and/or source plane and providing current to the selected state change element. In one embodiment, an erase mechanism may be carried out by a channel erase to the whole block or sectors.

The invention has been described herein in terms of several exemplary embodiments. Other embodiments of the invention will be apparent to those skilled in the art from consideration of the specification and practice of the invention. The embodiments and preferred features described above should be considered exemplary, with the scope of the invention being defined by the appended claims and their equivalents.

What is claimed is:

1. A multi-layer memory device, comprising:
   multiple layers of memory core cells;
   a word plane electrically connecting each first active terminal of the multiple layers of the memory core cells intersected by the word plane;
   a drain plane substantially orthogonal to the word plane, the drain plane electrically connecting each second active terminal of the multiple layers of the memory core cells intersected by the drain plane; and
   a source plane substantially orthogonal to both the word plane and the drain plane, the source plane electrically connecting each third active terminal of the memory core cells within a single level.

2. The multi-layer memory device of claim 1, further comprising:
   via holes interconnecting each source plane, wherein an axis associated with each via hole of a first source plane are substantially aligned with an axis associated with each corresponding via hole of a second source plane.

3. The multi-layer memory device of claim 1, wherein each of the memory core cells include a device having three active terminals, the device being one of a Metal-Oxide Semiconductor Field-Effect Transistor (MOSFET), a Bipolar Junction Transistor (BJT), and a Single Electron Device (SET).

4. The multi-layer memory device of claim 1, wherein the word plane functions as an x-decoder.

5. The multi-layer memory device of claim 1, wherein the drain plane functions as an y-decoder.

6. The multi-layer memory device of claim 1, wherein the source plane functions as a z-decoder.

7. The multi-layer memory device of claim 1, wherein each second active terminal of the multiple layers is connected to a state change element.

8. The multi-layer memory device of claim 7, wherein the state change element is selected from the group consisting of an antifuse, a fuse and a chalcogenide element.

9. The multi-layer memory device of claim 1, wherein each first active terminal of adjacent levels shares a word plane line.

10. A plane decoding method for a multi-layer memory device, comprising:
    defining a source plane in electrical communication with first active terminals associated with memory core cells within a level of the multi-layer memory device;
    interconnecting second active terminals associated with memory core cells of the multi-layer memory device with a word plane intersecting each level of the multi-layer memory device; and interconnecting third active terminals associated with memory core cells of the multi-layer memory device with a drain plane intersecting each level of the multi-layer memory device.

11. The method of claim 10, further comprising:
applying a first voltage to the word plane;
applying a second voltage to the drain plane; and
accessing a value stored within a memory core cell associated with an intersection of the source plane, the word plane and the drain plane.

12. The method of claim 1 wherein the method operation of applying a first voltage to the word plane includes,
applying a voltage of about 3 volts.

13. The method of claim 11, wherein the method operation of applying a second voltage to the drain plane includes,
applying a voltage of about 1 volt.

14. The method of claim 10, further comprising:
including a state change element with each of the third active terminals.

15. The method of claim 14, wherein the state change element is selected from the group consisting of a fuse, an antifuse, and chalcogenide material.

16. The method of claim 14, further comprising:
applying a current to the state change element to program a memory core cell associated with the state change element.

17. A method for accessing a memory core cell of a multi-layer memory device, comprising:
defining a first plane of memory core cells associated with a single level of the multi-layer memory device;
defining a second plane of memory core cells associated with multiple layers of the multi-layer memory device, the second plane being substantially orthogonal to the first plane;

defining a third plane of memory core cells associated with the multiple layers of the multi-layer memory device, the third plane being substantially orthogonal to both the first plane and the second plane; and applying a voltage to first and second terminals associated with each of the memory core cells of the second plane and the third plane.

18. The method of claim 16, wherein the method operation of applying a voltage to first and second terminals associated with each of the memory core cells of the second plane and the third plane includes,
applying a first voltage to the second plane of memory core cells; and
applying a second voltage to the third plane of memory core cells.

19. The method of claim 18, wherein the first voltage is greater than the second voltage.

20. The method of claim 17, wherein each memory core cell is configured to incorporate three active terminals.

21. The method of claim 17, further comprising:
applying a current to the identified memory core device; and
in response to applying the current, the method includes,
initiating a resistance change of a state change element associated with a third terminal of the memory core cell.

22. The method of claim 21, wherein the state change element is selected from the group consisting of a fuse, an antifuse, and a phase change material.

23. The method of claim 22 wherein the phase change material is chalcogenide.

* * * * *

UNITED STATES PATENT AND TRADEMARK OFFICE
Certificate

Patent No. 6,906,940 B1                                                                            Patented: June 14, 2005

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Hang-Ting Lue, Hsinchu (TW); and Ming-Hsiu Lee, Hsinchu (TW).

Signed and Sealed this Thirty-first Day of July 2012.

*RICHARD ELMS*
*Supervisory Patent Examiner*
*Art Unit 2824*
*Technology Center 2800*